United States Patent
Iila et al.

(10) Patent No.: US 10,097,004 B2
(45) Date of Patent: Oct. 9, 2018

(54) PHOTOVOLTAIC-BASED POWER SYSTEM

(71) Applicant: SMA Solar Technology AG, Niestetal (DE)

(72) Inventors: Kristo Iila, Tallinn (EE); Soeren Baekhoej Kjaer, Harrislee (DE); Christian Harald Benz, Flensburg (DE); Wulf-Toke Franke, Harrislee (DE)

(73) Assignee: SMA Solar Technology AG, Niestetal (DE)

( * ) Notice: Subject to any disclaimer, the term of this patent is extended or adjusted under 35 U.S.C. 154(b) by 250 days.

(21) Appl. No.: 14/745,733

(22) Filed: Jun. 22, 2015

(65) Prior Publication Data

US 2015/0288190 A1    Oct. 8, 2015

Related U.S. Application Data

(63) Continuation of application No. PCT/DK2013/050427, filed on Dec. 12, 2013.

(30) Foreign Application Priority Data

Dec. 21, 2012  (DK) ................... 2012 00824
Jan. 17, 2013  (EP) ..................... 13000226

(51) Int. Cl.
  *H02J 1/00*    (2006.01)
  *H02J 3/38*    (2006.01)
  (Continued)

(52) U.S. Cl.
  CPC ............ *H02J 3/383* (2013.01); *G01R 21/133* (2013.01); *H02M 7/42* (2013.01); *Y02B 10/14* (2013.01);
  (Continued)

(58) Field of Classification Search
  CPC .......... H02J 3/383; G01R 21/133; H02M 7/42
  (Continued)

(56) References Cited

U.S. PATENT DOCUMENTS

2010/0283325 A1*  11/2010  Marcianesi ............... G05F 1/67
                                                          307/82
2011/0232714 A1   9/2011   Bhavaraju et al.
  (Continued)

FOREIGN PATENT DOCUMENTS

EP    2477300 A1    7/2012
EP    2485189 A1    8/2012
  (Continued)

OTHER PUBLICATIONS

International Preliminary Report on Patentability dated Jun. 23, 2015 for International Application No. PCT/DK2013/050427.
  (Continued)

*Primary Examiner* — Thomas Skibinski
(74) *Attorney, Agent, or Firm* — Eschweiler & Potashnik, LLC

(57) ABSTRACT

The present disclosure relates to a photovoltaic power installation configured to deliver power to a power distribution grid at a point of common coupling, the photovoltaic power installation including a determination unit configured to determine an amount of self-consumed power of the photovoltaic power installation, and a first power inverter configured to generate power in accordance with 1) the determined amount of self-consumed power, and 2) a power level to be delivered at the point of common coupling. The disclosure further relates to an associated method.

17 Claims, 2 Drawing Sheets

(51) Int. Cl.
*G01R 21/133* (2006.01)
*H02M 7/42* (2006.01)
(52) U.S. Cl.
CPC ......... *Y02E 10/563* (2013.01); *Y10T 307/707* (2015.04)
(58) Field of Classification Search
USPC ............................... 307/82–84, 43; 136/244
See application file for complete search history.

(56) References Cited

U.S. PATENT DOCUMENTS

2012/0181974 A1\* 7/2012 Kuniyosi ................ H02J 3/383
320/101
2013/0140015 A1 6/2013 Hayashida

FOREIGN PATENT DOCUMENTS

| EP | 2485360 A1 | 8/2012 |
| EP | 2485361 A1 | 8/2012 |
| WO | 2012169116 A1 | 12/2012 |

OTHER PUBLICATIONS

International Search Report dated Jul. 4, 2014 for International Application No. PCT/DK2013/050427.

\* cited by examiner

PHOTOVOLTAIC-BASED POWER SYSTEM

REFERENCE TO RELATED APPLICATIONS

This application is a Continuation of International Application number PCT/DK2013/050427 filed on Dec. 12, 2013, which claims priority to Danish Application number PA 2012 00824, and European Application number EP13000226.4, filed on Jan. 17, 2013, the contents of which are incorporated by reference in their entirety.

FIELD

The present disclosure relates to a photovoltaic power distribution system. In particular, the present disclosure relates to a dynamic photovoltaic power distribution system taking into account the power consumption of the power distribution system itself.

BACKGROUND

Photovoltaic (PV) power installations are becoming more and more popular both in relation to domestic installations and industrial installations. However, PV power installations of today are not used in an efficient manner due to a lack of control of the installation's own power consumption.

SUMMARY

Some embodiments of the present disclosure provide a PV power distribution system that constantly delivers a predetermined amount of power at a point of common coupling.

Some embodiments of the present disclosure provide a PV power distribution system that takes into account or compensates for the system's own consumption of power.

In a first embodiment, a photovoltaic power installation configured to deliver power to a power distribution grid at a point of common coupling is disclosed. The photovoltaic power installation comprises
a determination component or unit configured to determine an amount of self-consumed power of the photovoltaic power installation, and a first power inverter configured to generate power in accordance with the determined amount of self-consumed power, and a predetermined power level to be delivered at the point of common coupling in accordance with a power reference.

It is an advantage of the photovoltaic (PV) power installation of one embodiment of the present disclosure that it may ensure that a predetermined power level delivered at the point of common coupling (PCC) complies with a power reference. Thus, the PV power installation of the present disclosure may compensate for fluctuations, intended or unintended, in the amount of self-consumed power.

The power reference may be provided to the installation in various ways, such as by wireless or wired communication from the operator of the power grid or by the provision of one or more relays by the operator of the power grid.

As an example the power reference may set a curtailment to a level of 70% of the nominal power level of the installation. This may imply that a power level of 70% of the nominal capacity of the installation is to be delivered at the PCC. For a 10 kW installation this corresponds to a maximum of 7 kW that is fed into the power grid until the power reference is changed. Alternatively, the power reference may be provided as an absolute value, such as for example a fixed value of 7 kW, or a value based on the installation's nominal power, name-plate power, acquired measured power, or on STC (Standard Test Conditions) of PV modules. Other alternatives for the power reference value may be dynamic values, such as those based on the time of day or year (schedule-based), or input obtained through an MMI (Man-Machine Interface) such as a display, personal computer, tablet computer or smartphone.

The PV power installation of the present disclosure may be a domestic installation, i.e. an installation typically having a capacity below 10 kW. Alternatively, the power installation may form part of a larger industrial installation.

The amount of self-consumed power may be determined in different ways. Firstly, the amount of self-consumed power may be measured directly within the installation by appropriate measuring means. Secondly, the amount of self-consumed power may be calculated from other power measurements within the installation. In this scenario the determining means may comprise the following measuring means; means for measuring a power level produced by the photovoltaic power installation and means for measuring a power level delivered at the PCC.

The photovoltaic power installation may further comprise a second power inverter interconnected to the first power inverter via a data network, such as an Ethernet-based or wireless network. In this scenario the first power inverter may be configured as a master power inverter, and the second power inverter is configured as a slave power inverter. Obviously, additional slave power inverters being controllable by the master power inverter may be provided as well. The master inverter may be configured to provide output power references to the slave inverter in accordance with the determined amount of self-consumed power and the power reference.

The master power inverter may be configured to receive and process information about the determined amount of self-consumed power. This information may originate from a direct measurement of self-consumed power, or it may originate from indirect measurements upon which the self-consumed power is calculated. Moreover, the master inverter may be configured to receive and process the power reference. The power reference may be received via a wireless receiver means, such as a radio receiver. As an example, a distribution network operator may provide a fixed or a dynamic power reference to the installation via the wireless receiver means, or alternatively via a wired connection. Alternatively, the power reference may be provided locally by the user or owner of the installation in agreement with the relevant authorities.

The means for measuring a power level produced by the photovoltaic power installation may form an integral part of the first power inverter.

In a second embodiment, the present disclosure relates to a method for operating a photovoltaic power installation configured to deliver power to a power distribution grid at a point of common coupling. The method comprises
determining an amount of self-consumed power of the photovoltaic installation, and
operating one or more power inverters of the photovoltaic power installation in accordance with:
the determined amount of self-consumed power, and a power level to be delivered at the point of common coupling in accordance with power reference.

Thus, the method of the second embodiment is concerned with the use of the photovoltaic power installation of the first embodiment. For that reason the configuration and implementation of the installation may be similar to what has been disclosed in connection with the first aspect.

Generally, information about the determined amount of self-consumed power and the power reference may be provided to a master power inverter among the one or more power inverters. The master power inverter may provide output power references to one or more slave power inverters among the one or more power inverters in accordance with the determined amount of self-consumed power and in accordance with the power reference. The power reference of the master inverter may be provided to the one or more slave inverters via a data network, such as an Ethernet-based or wireless network.

The properties of the power reference may be as disclosed in connection with the first embodiment. Thus, the power reference may be a fixed or a dynamic power reference provided by an operator of the power distribution grid or a local user of the installation. As mentioned earlier the power reference may reflect a percentage of a nominal power capacity of the photovoltaic power installation or it may be provided as an absolute value. In both cases the power reference may be a fixed or a dynamic value.

BRIEF DESCRIPTION OF THE DRAWINGS

The present disclosure will now be described in further details with reference to the accompanying figures, where.

Figure 1:
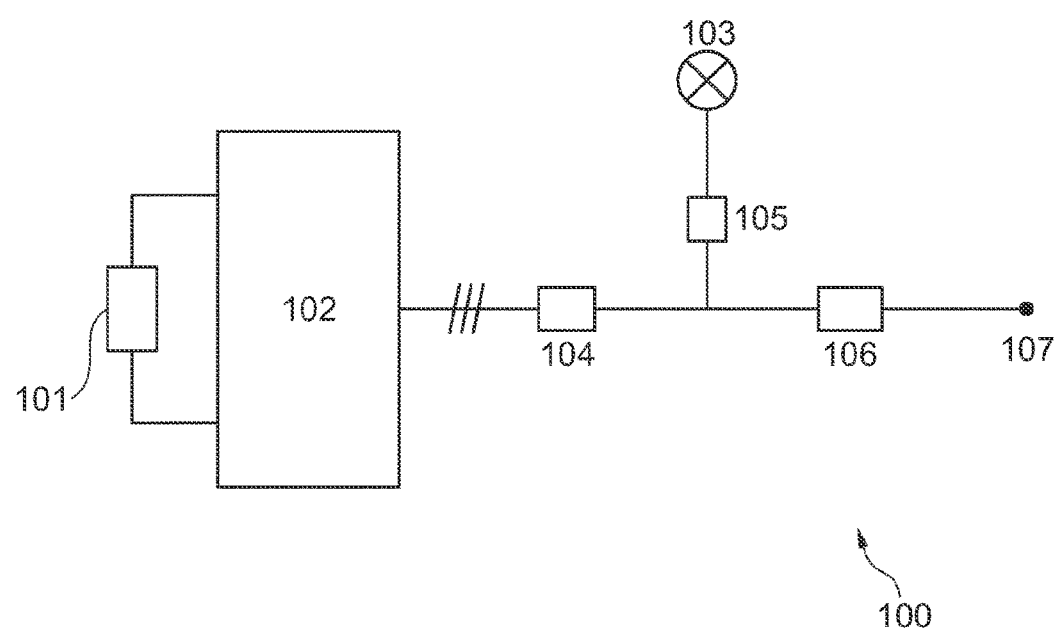
FIG. 1 shows a schematic of a simple power installation.

While the disclosure is susceptible to various modifications and alternative forms, specific embodiments have been shown by way of examples in the drawings and will be described in detail herein. It should be understood, however, that the disclosure is not intended to be limited to the particular forms disclosed. Rather, the disclosure is to cover all modifications, equivalents, and alternatives falling within the spirit and scope of the disclosure as defined by the appended claims.

DETAILED DESCRIPTION

In its most general aspect the present disclosure relates to a PV power installation that is capable of maintaining a predetermined power level at a PCC independent of an actual level of self-consumed power.

Referring now to FIG. 1 a schematic of a PV power installation 100 according to the present disclosure is depicted. As depicted in FIG. 1 the installation 100 comprises a PV array 101 which is connected to a power inverter 102. The power inverter 102 is configured to convert DC power from the PV array 101, or any other DC energy sources, to AC power, such as single or multiphase AC power. The installation is adapted to feed power, such as three-phase AC power, into a power grid (not shown) via PCC 107. The power may optionally be fed into the power grid via a grid transformer (not shown).

The PV power installation 100 has a self-consumption of power indicated by bulb 103. The term self-consumption should here be understood as in principle any kind of drawing of power from between the power inverter 102 and the PCC 107. The power may be drawn from a single phase or from a plurality of phases.

According to the present disclosure, the amount of self-consumed power must be determined. Still referring to FIG. 1, this determination can be performed in various ways. Firstly, the amount of self-consumed power may be measured directly by power meter 105. Alternatively, the amount of self-consumed power may be determined by subtracting the power level measured by meter 106 from the power level measured by meter 104 while noting that meter 104 may optionally be integrated in the power inverter 102. In any case the following expression applies:

$$P_{INVERTER} = P_{self} + P_{PCC}$$

where $P_{INVERTER}$ is the inverter generated power, $P_{self}$ is the self-consumed power and $P_{PCC}$ is the amount of power delivered at the PCC.

Information relating to the amount of self-consumed power is provided to or calculated by the power inverter 102 or to a controller (not shown) for further data processing. The power inverter 102 or the controller may use this information for controlling the power output of the power inverter 102 or for controlling a total amount of self-consumed power. The latter may involve activation or deactivation of for example home or industrial appliances in order to increase or decrease the consumed amount of power, respectively.

Figure 2:
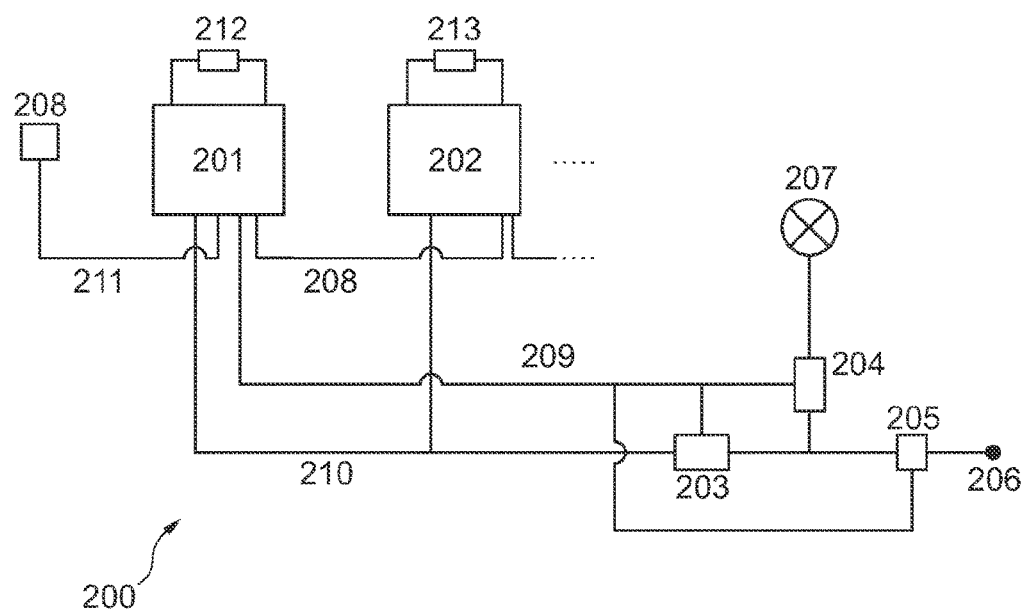
FIG. 2 shows a schematic of a master/slave power installation.

Referring now to FIG. 2, a PV power installation 200 comprising a master inverter 201 and a slave inverter 202 is depicted. Additional slave power inverters may optionally be provided. The master and slave power inverters communicate via an Ethernet, or similar communication network 208, such as RS485, Bluetooth, ZigBee, Zeeware etc. The AC power generated by inverters 201, 202 is fed to the PCC via the internal power grid 210. The power inverters 201, 202 are fed from respective PV modules/arrays 212, 213. A wireless receiver 208, such as a radio receiver, which is adapted to receive a power reference, is connected to the master power inverter 201 via communication link 211. The power reference may alternatively be provided via a wired connection.

The power reference may be provided by the operator of the power distribution grid. Alternatively, the power reference may be provided by a local user of the installation in agreement with the relevant authorities. The local user may enter the power reference into the installation by using a keyboard or touchscreen of the installation. As previously discussed this power reference may be a fixed reference or a dynamic reference. The power reference itself may reflect various parameters, such as an amount of power (fixed or variable) to be delivered at the PCC, a percentage of the nominal capacity of the installation (i.e. power a curtailment level) etc.

Results of various power measurements within the installation are provided from measuring devices 203, 204, 205 to the master power inverter 201 via a common communication link 209. Only two of the measuring devices are needed in order to gain the required power information. The installation's self-consumption is illustrated by bulb 207.

The master power inverter 201 is capable of controlling the slave power inverter 202 via communication link 208. Thus, the master power inverter 201 controls its own power production as well as the power production of the slave power inverter 202 (and additional slave inverters as well) using at least one of the following control parameters:

1. The available amount of power from the PV module/array
2. The power reference
3. The amount of self-consumed power The nominal power capacity of each power inverter may vary from a few kW to, in principle, any capacity. Also, the nominal power capacity of the installation as a whole may be tuned to specific purposes by selecting an appropriate number of power inverters.

The applicability of the PV power installation according to the disclosure is huge, and it may thus cover the following approaches in which the availability of measurements of two of: 1) the available amount of power from the PV module/array, 2) the power supplied at the point of common coupling and 3) the amount of self-consumed power together with the power reference, enable the PV power installation to control the self-consumed power so that some optimum state is achieved.

This optimum state may be, for example, that as much power is generated by the PV module/array whilst complying the curtailment level in force. As an example the power reference may set a curtailment to a level of 70% of the nominal power level of the installation. This may imply that a power level of 70% of the nominal capacity of the installation is to be delivered at the PCC. For a 10 kW installation this corresponds to a maximum of 7 kW which is fed into the power grid until the power reference is changed.

In the case that the installation is capable of generating, for example, 9 kW at a particular point in time, selected consumer devices, such as home or industrial appliances, may be activated automatically by the installation. In this example the total power consumption of the selected consumer devices must be kept above 2 kW in order to comply with the curtailment level of 70% while simultaneously allowing the PV module/array to generate as much of the 9 kW available at the time as possible.

Approaches suitable for realizing this method include the following:

Active Timing of Home Appliances

This approach is considered the easiest way to increase the self-consumption of the installation. It only requires a small change in consumer's behavior, namely that the consumer delays the start of a certain appliance, i.e. the consumer does not start a certain appliance immediately when the appliance is ready. Instead the consumer programs a starting time of the appliance depending on the PV power installation and season. This approach may be relevant for washing of clothes loaded into the washing machines.

Use of Signaling Output of Power Inverter Based on Available PV Power

Home appliance devices of today, such as washing machines and clothes dryers, have built-in delay functions. It is expected that these home appliance devices will be prepared for external triggering in the future. Thus, in case a master power inverter is capable of generating triggering signals for external use the PV power installation may trigger, and thereby start, home appliance devices, such as washing machines, clothes dryers etc., at appropriate time periods, such as during periods with high power production.

Utilization of Signaling by PV Inverter Based on PV Production and on Power Flow at PCC This control scheme involves external information from power meters, power production, the existence of a power curtailment (remote or local, temporary or constant) requirement, as well as information, such as the time of day, season, load profile, consumption of home appliances and specific/historical data (i.e. production and load profiles) if available. The available information is applied in order to decide which home appliance it would be optimal to use, and subsequently signal (by visualization, SMS, relay or direct control) that a particular home appliance or appliances, or a sequence of home appliances, should be turned on or off. The described approach could also be used when power curtailment is applied at the PCC to evaluate the true generation plant maximum output power.

Another way of signaling is visualization to the end user. This could be done in a variety of ways, such as a warning light (light bulb, LED etc.), push notification, Twitter, sending an SMS etc. This method of signaling overcomes the problem that home appliances are not currently remotely controllable, i.e. directly triggerable using a trigger signal. Instead this method makes use of the fact that the end user, or someone in the end user's family, might be at home, and thereby able to turn on the relevant home appliances.

Many variations and modifications may be made to the preferred embodiments of the disclosure without departing substantially from the spirit and principles of the disclosure. All such modifications and variations are intended to be included herein within the scope of the present disclosure, as defined by the following claims.

The invention claimed is:

1. A photovoltaic power installation configured to deliver power to a power distribution grid at a point of common coupling, the photovoltaic power installation comprising:
   a determination unit configured to determine an amount of self-consumed power of the photovoltaic power installation, and
   a first power inverter configured to generate power in accordance with the determined amount of self-consumed power, and configured to deliver a power level at the point of common coupling in accordance with an externally provided power reference,
   wherein the power reference comprises a fixed or dynamic amount of power to be delivered at the point of common coupling or a percentage of a nominal capacity of the photovoltaic power installation, wherein the dynamic amount of power comprises a dynamic value based on a time of the day, or a time of the year, or a value manually provided by a user.

2. A photovoltaic power installation according to claim 1, further comprising a second power inverter interconnected to the first power inverter via a data network.

3. A photovoltaic power installation according to claim 2, wherein the first power inverter is configured as a master power inverter, and the second power inverter is configured as a slave power inverter.

4. A photovoltaic power installation according to claim 3, further comprising additional slave power inverters being controllable by the master power inverter.

5. A photovoltaic power installation according to claim 3, wherein the master power inverter is configured to receive and process information about the determined amount of self-consumed power.

6. A photovoltaic power installation according to claim 3, wherein the master inverter is configured to receive and process the power reference.

7. A photovoltaic power installation according to claim 3, wherein the master inverter is configured to provide output power references to the slave inverter in accordance with the determined amount of self-consumed power and the power reference.

8. A photovoltaic power installation according to claim 1, further comprising a receiver unit configured to receive the power reference.

9. A photovoltaic power installation according to claim 1, wherein the determination unit comprises at least two of the following: a first measurement unit configured to measure a power level produced by the photovoltaic installation, a second measurement unit configured to measure the self-consumption, and a third measurement unit configured to measure a power level delivered at the point of common coupling.

10. A photovoltaic power installation according to claim 9, wherein the first measurement unit forms an integral part of the first power inverter.

11. A method for operating a photovoltaic power installation configured to deliver power to a power distribution grid at a point of common coupling, the method comprising:
    determining an amount of self-consumed power of the photovoltaic installation using a first measurement unit, and
    operating one or more power inverters of the photovoltaic power installation in accordance with:
    the determined amount of self-consumed power, and
    a power level to be delivered at the point of common coupling in accordance with an externally provided power reference,
    wherein the power reference comprises a fixed or dynamic amount of power to be delivered at the point of common coupling or a percentage of a nominal capacity of the photovoltaic power installation, wherein the dynamic amount of power comprises a dynamic value based on a time of the day, or a time of the year, or a value manually provided by a user.

12. A method according to claim 11, further comprising providing information about the determined amount of self-consumed power and the power reference to a master power inverter among the one or more power inverters.

13. A method according to claim 12, further comprising providing, via the master power inverter, output power references to one or more slave power inverters among the one or more power inverters in accordance with the determined amount of self-consumed power and in accordance with the power reference via a data network.

14. A method according to claim 11, wherein the power reference varies over time, and wherein the power reference is given as a percentage of a nominal power capacity of the photovoltaic installation.

15. A method according to claim 14, wherein the power reference is provided remotely by an operator of the power distribution grid.

16. A method according to claim 14, wherein the power reference is provided locally by a user of the installation.

17. A method according to claim 11, further comprising calculating, using a calculation unit, the power level at the point of common coupling as a difference between a produced total power level of the photovoltaic power installation and the determined amount of self-consumed power.

* * * * *